United States Patent
Okuno et al.

(10) Patent No.: US 10,996,800 B2
(45) Date of Patent: May 4, 2021

(54) DISPLAY DEVICE

(71) Applicant: LG Display Co., Ltd., Seoul (KR)

(72) Inventors: Harumi Okuno, Tokyo (JP); Isao Adachi, Tokyo (JP)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/660,002

(22) Filed: Oct. 22, 2019

(65) Prior Publication Data

US 2020/0125196 A1 Apr. 23, 2020

(30) Foreign Application Priority Data

Oct. 23, 2018 (JP) .............................. JP2018-199287

(51) Int. Cl.
*G06F 3/044* (2006.01)
*H01L 27/28* (2006.01)
*H01L 27/32* (2006.01)
*G06F 3/041* (2006.01)
*H01L 51/52* (2006.01)

(52) U.S. Cl.
CPC ............ *G06F 3/044* (2013.01); *G06F 3/0418* (2013.01); *H01L 27/288* (2013.01); *H01L 51/5296* (2013.01)

(58) Field of Classification Search
None
See application file for complete search history.

(56) References Cited

U.S. PATENT DOCUMENTS

| 2010/0271048 A1* | 10/2010 | Kouno ................. G06F 3/044 324/658 |
| 2012/0178611 A1* | 7/2012 | Ajiki ................. C03C 17/007 501/32 |
| 2018/0061899 A1 | 3/2018 | Oh et al. | |

FOREIGN PATENT DOCUMENTS

| KR | 10-2017-0081002 A | 7/2017 |
| KR | 10-2017-0121904 A | 11/2017 |

OTHER PUBLICATIONS

Korean Office Action dated Aug. 27, 2020 issued in corresponding Patent Application No. 10-2019-0102311 (4 pages).

* cited by examiner

*Primary Examiner* — Sepehr Azari
(74) *Attorney, Agent, or Firm* — Polsinelli PC

(57) ABSTRACT

A display device includes a pixel electrode layer in which a plurality of light emitting elements constituting respective pixels are arranged in two dimensions; a touch sensor layer in which a plurality of touch sensor electrodes constituting a touch sensor are arranged in two dimensions; and a touch buffer layer between the pixel electrode layer and the touch sensor layer such that the pixel electrode layer and the touch sensor layer are capacitively coupled to each other, the touch buffer layer being optically transparent and including a base material and hollow particles dispersed in the base material.

20 Claims, 10 Drawing Sheets

DISPLAY DEVICE

CROSS REFERENCE TO RELATED APPLICATION

The present application claims priority from and the benefit under 35 U.S.C. § 119(a) of Japanese Patent Application No. 2018-199287 filed on Oct. 23, 2018, which is hereby incorporated by reference in its entirety.

BACKGROUND

Field of the Disclosure

The present disclosure relates to a display device, and more particularly to a display device equipped with a touch sensor.

Description of the Background

In a related art display device equipped with a touch sensor, a pixel electrode layer for a display function is formed on a pixel substrate, a touch sensor layer for a touch sensor function is formed on a sensor substrate, and the substrates are attached to each other. Specifically, a rear surface of the sensor substrate, that is, a substrate surface on the side where the touch sensor layer is not disposed, and a front surface of the pixel substrate, that is, a surface on the side where the pixel electrode layer is formed. The sensor substrate and the pixel substrate are attached by an adhesive. In such a configuration, since the sensor substrate having a relatively low dielectric constant is interposed between the touch sensor layer and the pixel electrode layer, the two layers are not capacitively coupled and the mutual operation is not interfered. However, in this configuration, the manufacturing cost is increased because of the bonding process of the two substrates. In order to omit the bonding process of the sensor substrate, U.S. Patent Publication No. 2018/0061899 (referred to herein as Patent document 1) discloses the pixel substrate where a touch sensor layer is formed over the pixel electrode layer through a touch buffer layer.

However, in the display device of Patent Document 1, since the touch sensor layer and the pixel electrode layer are capacitively coupled by the touch buffer layer as described later, noise may be generated in the touch detection due to the capacitive component of the touch buffer layer. This detection noise can decrease the touch detection performance of the touch sensor, that is, the touch detection accuracy.

SUMMARY

Accordingly, the present disclosure is directed to a display device equipped with a touch sensor that substantially obviates one or more of the problems due to limitations and disadvantages of the related art.

An object to be solved by the present disclosure is to provide a display device equipped with a touch sensor having the improved touch detection accuracy.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided a display device that includes a pixel electrode layer in which a plurality of light emitting elements constituting respective pixels are arranged in two dimensions; a touch sensor layer in which a plurality of touch sensor electrodes constituting a touch sensor are arranged in two dimensions; and a touch buffer layer between the pixel electrode layer and the touch sensor layer such that the pixel electrode layer and the touch sensor layer are capacitively coupled to each other, the touch buffer layer being optically transparent and including a base material and hollow particles dispersed in the base material.

It is to be understood that both the foregoing general description and the following detailed description are exemplary and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate aspects of the present disclosure and together with the description serve to explain the principles of the present disclosure.

In the drawings.

DETAILED DESCRIPTION

Reference will now be made in detail to aspects of the disclosure, examples of which are illustrated in the accompanying drawings.

<First Aspect>

Figure 1:
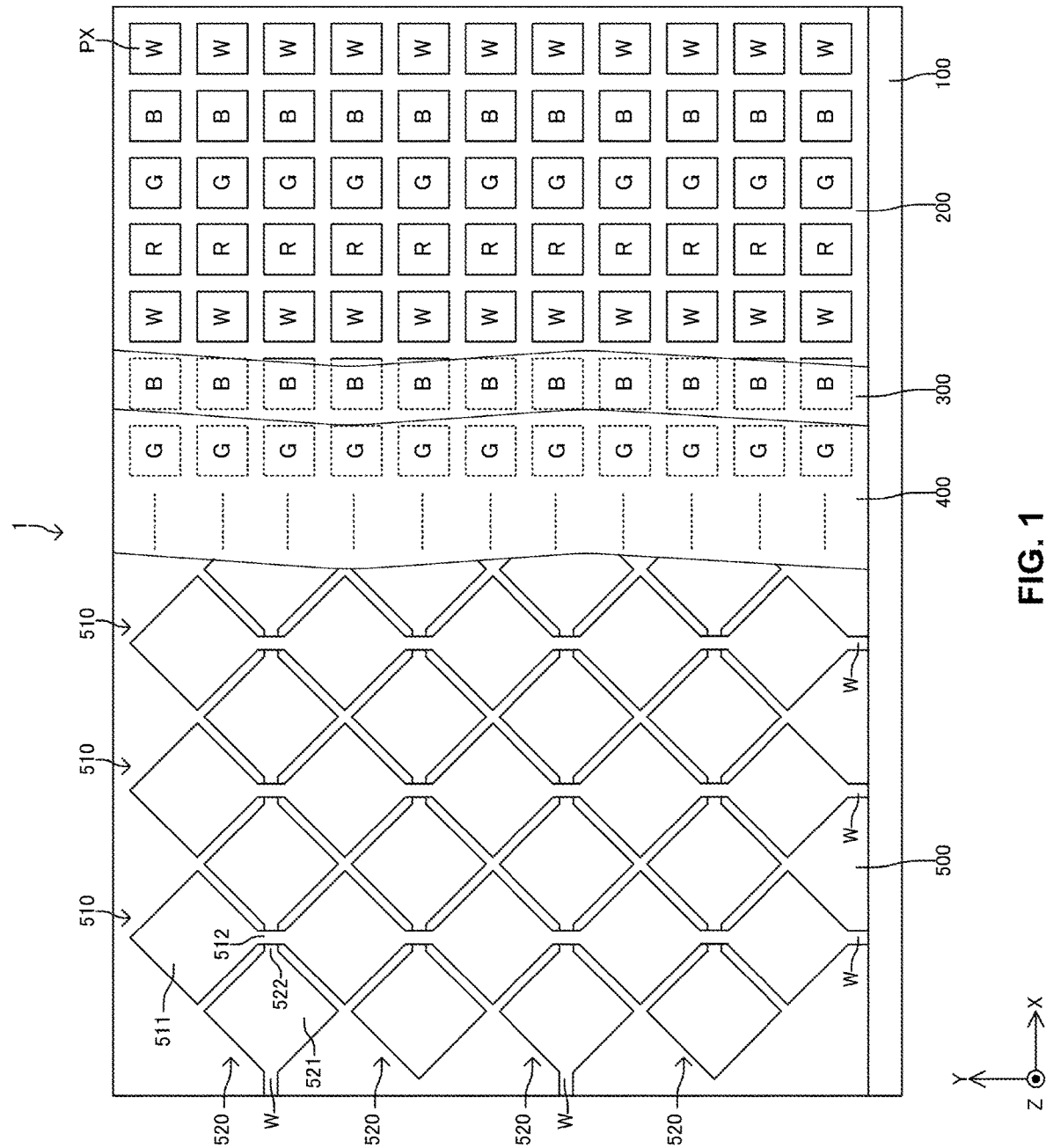
FIG. 1 is a schematic exploded top view illustrating a display device according to a first aspect of the present disclosure.

FIG. 1 is a schematic exploded top view illustrating an active area of a display device according to a first aspect of the present disclosure. In the present disclosure, each drawing is a schematic diagram for description and is not illustrated according to the measurements. In particular, a plurality of repeated components is shown with the drastically decreased number for clarity of illustration.

The display device 1 includes a substrate 100, a pixel electrode layer 200, an encapsulation layer 300, a touch buffer layer 400 and a touch sensor layer 500. The display device 1, for example, constitutes a display screen of a terminal equipped with a touch sensor function such as a smartphone or a tablet computer. The pixel electrode layer 200, the encapsulation layer 300, the touch buffer layer 400 and the touch sensor layer 500 are stacked on the substrate 100 in this order, and a part of each layer is shown in FIG. 1. In the following description, directions parallel to two sides defining a display surface of the display device 1 are referred to as X and Y directions, respectively, and a direction perpendicular to the display surface (that is, the direction perpendicular to the X-Y plane) is referred to as a Z direction. In addition, in the present disclosure, the expression of 'upper (or upper layer)' or 'lower (or lower layer)' does not limit the positional relationship in actual use. However, for convenience of description, the 'up' direction means a direction from the substrate 100 toward the touch sensor layer 500, and the 'down' direction means a direction from the touch sensor layer 500 toward the substrate 100.

The pixel electrode layer 200 constitutes a pixel surface having a plurality of pixels PX arranged in two dimensions on the substrate 100. The plurality of pixels PX includes a red R pixel, a green G pixel, a blue B pixel and a white W pixel and is arranged in a matrix according to a predetermined arrangement rule. As described in detail later, in the first aspect, each pixel PX of the pixel electrode layer 200 is configured to be an organic light emitting diode (hereinafter, referred to as OLED) which is an organic light emitting element using organic electroluminescence (organic EL). Each pixel PX is connected to a drive control circuit (not shown) for controlling the operation of the OLED.

The encapsulation layer 300 is a protective layer that includes multiple layers and blocks moisture, oxygen, and the like from entering the pixel electrode layer 200. That is, the encapsulation layer 300 has a function of encapsulating the pixel electrode layer 200. In addition, the encapsulation layer 300 may have a planarization function of flattening unevenness of a top surface of the pixel electrode layer 200.

The touch sensor layer 500 constitutes a projected capacitive type touch sensor. That is, the touch sensor layer 500 forms a touch sensor surface which consists of a plurality of touch sensor electrodes arranged in two dimensions and detects touch operation by a user. The touch sensor includes a plurality of X electrode lines 510 and a plurality of Y electrode lines 520. The plurality of X electrode lines 510 are arranged in parallel to the X direction, and the plurality of Y electrode lines 520 are arranged in parallel to the Y direction. Each X electrode line 510 includes a plurality of X electrodes (touch sensor electrodes) 511 connected to each other through a bridge 512 in the Y direction, and each Y electrode line 520 includes a plurality of Y electrodes (touch sensor electrodes) 521 connected to each other through a bridge 522 in the X direction. The plurality of X electrodes 511 and the plurality of Y electrodes 521 are disposed to alternately cover different portions of the active area when viewed from the X-Y plane. The bridge 512 and the bridge 522 cross each other when viewed from the X-Y plane and are insulated from each other through an insulating layer (not shown) in the Z direction. In other words, the X layer including the plurality of X electrode lines 510 and the Y layer including the plurality of Y electrode lines 520 form two layers insulated from each other through an insulating layer having a predetermined capacitance. Each X electrode line 510 and each Y electrode line 520 are connected to a detection processing circuit (not shown) for detecting touch operation through each wiring W, which is connected to one end of each row or each column. In addition, the electrode including the pixel electrode layer 200, the touch sensor layer 500, and the like may be a transparent conductive layer such as ITO or IZO, for example.

The touch buffer layer 400 functions as a planarization layer that fills the recesses of the encapsulation layer and flattens an interface with the touch sensor layer 500 while also functioning as a buffer layer that absorbs stress that may occur between the encapsulation layer 300 and the touch sensor layer 500. Namely, the touch buffer layer 400 has a planarization function and a buffer function. The touch buffer layer 400 is a layer required along with the pixel electrode layer 200 and the touch sensor layer 500 being formed on the same substrate 100 (not formed on respective substrates). In addition, the encapsulation layer 300, the touch buffer layer 400 and the touch sensor layer 500 each form an optically and substantially transparent layer. That is, each of the encapsulation layer 300, the touch buffer layer 400 and the touch sensor layer 500 is transparent.

Figure 2:
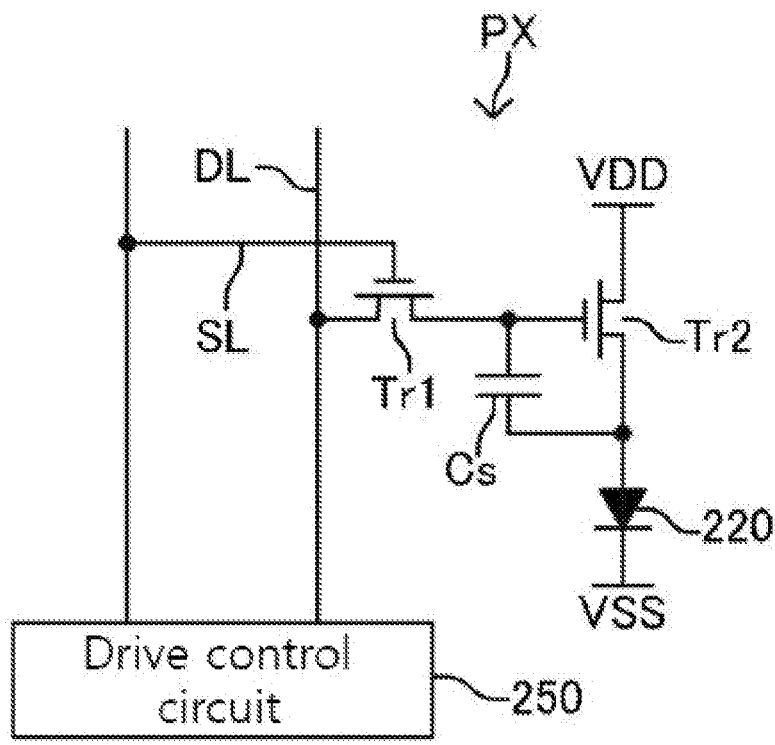
FIG. 2 is an equivalent circuit diagram of a pixel according to the first aspect of the present disclosure.

FIG. 2 shows an equivalent circuit of a pixel PX (the pixel electrode layer 200) of the first aspect. Each pixel PX includes a selection transistor Tr1, a driving transistor Tr2, a capacitor Cs and a light emitting element 220. In addition, the pixel PX is connected to a data line DL, a scan line SL, a high potential power supply voltage VDD and a low potential power supply voltage VSS, and they are connected to a drive control circuit 250. The light emitting element 220 is formed from an OLED and has a luminescent color of red R, green G, blue B and white W constituting the pixel surface in the first aspect. An anode of the light emitting element 220 is connected to the power supply voltage VDD through the driving transistor Tr2, and a cathode of the light emitting element 220 is connected to the power supply voltage VSS. The selection transistor Tr1 is formed from a MOSFET (metal oxide semiconductor field effect transistor), a drain is connected to the data line, a gate is connected to the scan line SL, and source is connected to a gate of the driving transistor Tr2. The driving transistor Tr2 is formed from a MOSFET, the gate is connected to the source of the selection transistor Tr1, a drain is connected to the power supply voltage VDD, and a source is connected to the anode of the light emitting element 220. The capacitor Cs is connected in parallel to the gate-source of the driving transistor Tr2.

The driving or stopping of the light emitting element 220 is determined according to the level of the scan line SL. When the light emitting element 220 is driven, its luminance is determined according to the voltage of the data line DL. When the light emitting element 220 is scanned (driven), the level of the scan line SL is a high level. Otherwise, the level of the scan line SL is a low level. When the level of the scan line SL is a high level, the selection transistor Tr1 is turned on, and a voltage based on the voltage of the data line DL is charged in the capacitor Cs. When the voltage of the capacitor Cs exceeds the threshold voltage of the driving transistor Tr2, the driving transistor Tr2 is turned on. The driving transistor Tr2 in the ON state supplies a drain current from the power supply voltage VDD to the light emitting element 220 according to the gate voltage, that is, the voltage of the data line DL. The light emitting element 220 emits light according to the drain current. The capacitor Cs functions as a so-called storage capacitor and maintains the luminous state or the nonluminous state of the light emitting element 220 by maintaining the gate-source voltage of the driving transistor Tr2 in one scan frame until the next scan frame.

Figure 3:
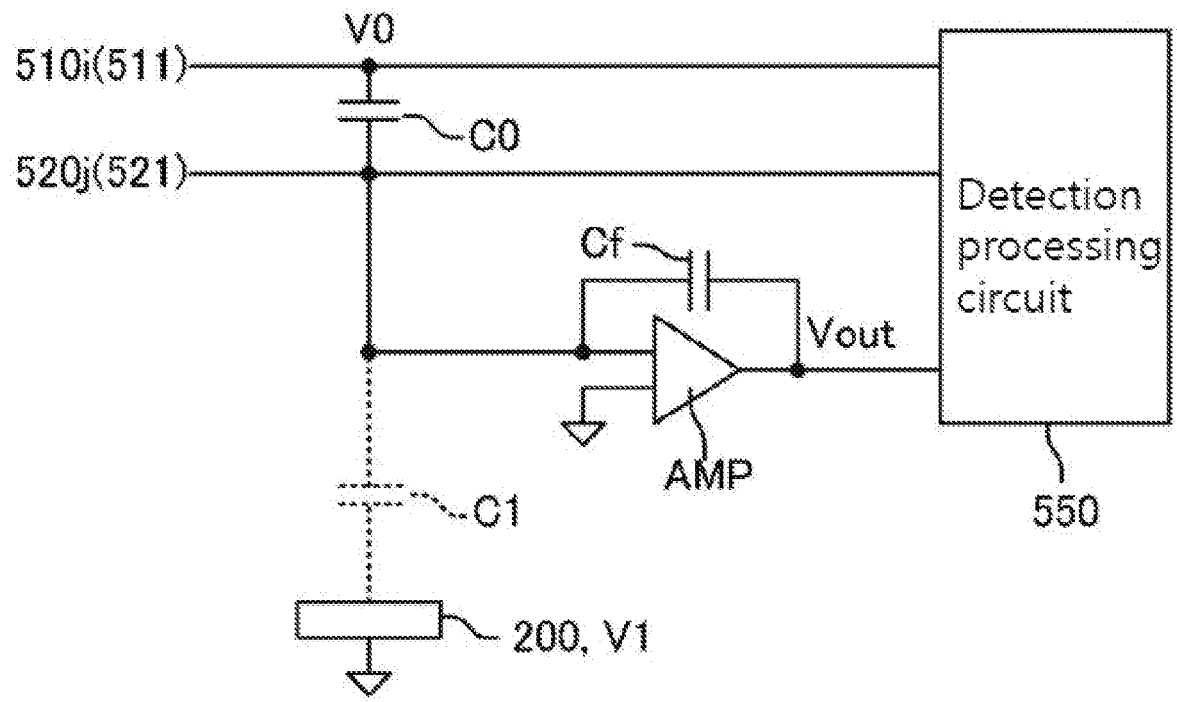
FIG. 3 is an equivalent circuit diagram explaining operation regarding a touch sensor.

FIG. 3 shows an equivalent circuit diagram explaining the operation regarding a touch sensor. FIG. 3 is an equivalent circuit of a portion of the X electrode 511 of the X electrode line 510$i$ of the ith row and the Y electrode 521 of the Y electrode line 520$j$ of the jth column, that is, the coordinate point (i, j) of the active area. The potential difference between the X electrode 511 and the Y electrode 521 is V0, and the capacitance between the X electrode 511 and the Y electrode 521 is C0. The amplifier AMP and the capacitor Cf are connected to the capacitance C0. Specifically, in the amplifier AMP, one input terminal is connected to the capacitance C0, the other input terminal is connected to a reference potential (for example, the power supply voltage VSS), and the capacitor Cf is connected to the one input terminal and the output terminal. For example, the amplifier AMP is a differential amplifier circuit. In this case, the one input terminal is an inverting input terminal, and the other input terminal is a non-inverting input terminal. The output voltage Vout at the output terminal of the amplifier AMP is connected to the detection processing circuit 550. In general, the detection processing circuit 550 detects the change of the output voltage Vout while supplying the voltage V0 to the X electrode line 510$i$ (the X electrode 511). When the output voltage Vout changes due to the change of the capacitance C0, the detection processing circuit 550 determines that there has been a touch operation at the coordinate point (i, j). In addition, the change of the capacitance C0 accompanying the touch operation is caused by a capacitance component resulting from a human body equivalently connected in parallel to the capacitance C0.

Here, for example, when the touch sensor layer 500 is formed on a separate substrate independent from the substrate 100, that is, in an ideal case that a substrate having a very low dielectric constant is disposed in place of the touch buffer layer 400, the output voltage Vout is expressed by the following formula.

$$Vout=(C0/Cf)\times V0$$

However, when the touch sensor layer 500 and the pixel electrode layer 200 are capacitively coupled without a low dielectric substance such as a substrate interposed therebetween, that is when the touch buffer layer 400 is interposed therebetween, the V change of the pixel electrode layer 200 may affect the output voltage Vout. When the potential of the pixel electrode layer 200 is V1 and the capacitance between the pixel electrode layer 200 and the touch sensor layer 500 is C1, the output voltage Vout is expressed by the following formula.

$$Vout=(C0/Cf)\times V0+(C1/Cf)\times V1$$

Therefore, $(C1/Cf) \times V1$ of the second term acts as a detection noise in the touch operation detection, whereby the detection accuracy or detection performance as the touch sensor may be lowered.

Accordingly, in order to suppress the influence of the second term, the capacitance C1 may be decreased. Generally, in a capacity element such as a capacitor, when the relative permittivity of the material between the electrodes is εs, the area of the electrodes is S, the distance between the electrodes d, and the vacuum permittivity is ε0, the capacitance C of the capacitor is expressed as $C=\varepsilon_0 \times \varepsilon_s \times S/d$. If the thickness (distance in the Z direction) of the encapsulation layer 300 or the touch buffer layer 400, the capacitance C1 is decreased, but this case causes the overall thickness of the display device 1. Therefore, in the present disclosure, the touch buffer layer 400 is configured as having a function of reducing the dielectric constant as described later. Thus, the capacitance C1 decreases.

Figure 4:
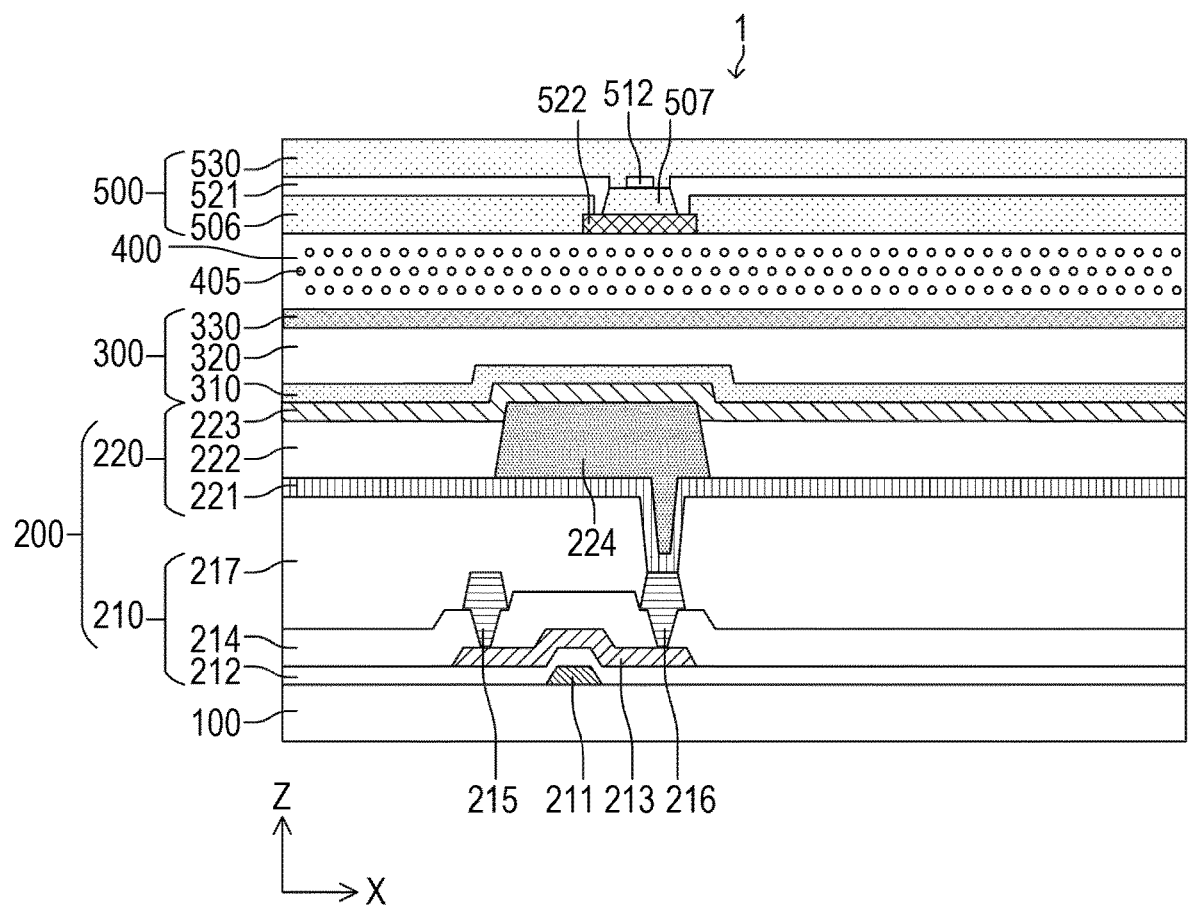
FIG. 4 is a schematic cross-sectional view of a display device according to the first aspect of the present disclosure.

FIG. 4 shows a schematic cross-sectional view of the display device 1 of the first aspect. As described above, the display device 1 includes the pixel electrode layer 200, the encapsulation layer 300, the touch buffer layer 400 and the touch sensor layer 500 sequentially stacked on the substrate 100. In FIG. 4, an area corresponding to the driving transistor Tr2 and the light emitting element 220 is shown as the pixel electrode layer 200 (see FIG. 2), and an area corresponding to the Y electrode 521, the bridge 512 and the bridge 522 is shown as the touch sensor layer 500 (see FIG. 1).

The pixel electrode layer 200 includes a driving element 210 and a light emitting element (OLED) 220.

In the driving element 210, a gate electrode 211 and a gate insulating layer 212 covering the gate electrode 211 are formed on the substrate 100 such as a silicon substrate. A semiconductor layer 213 is formed in a predetermined region covering the gate electrode 211 on the gate insulating layer 212. An interlayer insulating layer 214 is formed on the semiconductor layer 213. A drain electrode 215 and a source electrode 216 are formed on the interlayer insulating layer 214. The drain electrode 215 and the source electrode 216 pass through the interlayer insulating layer 214 and reach the semiconductor layer 213. A passivation layer 217 is formed to cover the interlayer insulating layer 214, the drain electrode 215 and the source electrode 216.

In the light emitting element 220, an anode electrode 221 is formed on the passivation layer 217. The anode electrode 221 passes through the passivation layer 217 and is connected to the source electrode 216. An organic electroluminescent layer (organic EL layer) 222 is formed on the anode electrode 221, and a cathode electrode 223 is formed on the organic electroluminescent layer 222. Additionally, in the organic electroluminescent layer 222, a bank 224 is partially formed as a spacer between the anode electrode 221 and the cathode electrode 223.

The encapsulation layer 300 includes an inorganic material layer 310, an organic material layer 320 and an inorganic material layer 330 from the bottom on the cathode electrode 223. The encapsulation layer 300 prevents external moisture, oxygen and the like of the display device 1 from reaching the light emitting element 220, particularly, the organic electroluminescent layer 222. The inorganic material layer 310 is formed of an inorganic insulating material that can be deposited at low temperatures such as silicon nitride ($SiN_X$), silicon oxide ($SiO_X$), silicon oxynitride (SiON), aluminum oxide ($Al_2O_3$), or the like. The selection of the inorganic material is for enabling the encapsulation layer 300 to be formed by a process that does not thermally affect the organic electroluminescent layer 222 having low heat resistance. The organic material layer 320 is formed of an organic material such as acrylic resin, epoxy resin, polyimide, polyethylene, silicon oxycarbon (SiOC), or the like. The organic material layer 320 is relatively flexible and serves to relieve the stress that may occur between the inorganic material layer 310 and the inorganic material layer 330. The inorganic material layer 330 is formed of an inorganic material such as silicon nitride (SiNx), silicon oxide (SiOx), silicon oxynitride (SiON), aluminum oxide ($Al_2O_3$), or the like.

The touch buffer layer 400 is formed on the inorganic material layer 330. In the first aspect, the touch buffer layer 400 includes an acrylic organic material resin having relatively high transparency as a base material and further includes nano-sized hollow particles 405 in the base material. In addition, the organic material used as the base material is an organic insulating material which has a high planarization function and is also optically transparent. The organic material may be an epoxy resin, a siloxane resin, or the like in addition to the acrylic resin. The dielectric contact of the hollow particles 405 is sufficiently lower than that of the base material because the inside thereof is hollow. Therefore, since the touch buffer layer 400 includes the hollow particles 405, the dielectric constant of the touch buffer layer 400 is lowered as compared with the case that the touch buffer layer 400 does not include the hollow particles 405. The dielectric constant of the touch buffer layer 400 varies depending on the content of the hollow particles 405.

In order to maintain the visual optical properties of the touch buffer layer 400, the diameter of the hollow particles 405 is equal to or less than about 400 nm, which is a substantial lower limit of the visible light wavelength range, or equal to or less than 360 nm, which is a certain lower limit, and equal to or less than 300 nm. Since the touch buffer layer 400 includes such nano-sized hollow particles 405, the dielectric constant of the touch buffer layer 400 can be reduced while maintaining its transparency. In addition, the diameter of the hollow particles 405 is set to be less than the visible light wavelength to prevent scattering of the visible light.

Furthermore, the hollow particles 405 each have an organic shell. It is beneficial that the organic shell is formed of acrylic resin such as poly(methyl methacrylate) (PMMA) for the transparency and durability. Since the hollow particles 405 have the organic shell, the resin dispersibility of the hollow particles in the base material of the organic material is ensured. Moreover, since the hollow particles 405 have the organic shell, the low haze property in the touch buffer layer 400 is maintained. Proper mixing of the hollow particles 405 and the like will be described later.

In addition, since the base material of the touch buffer layer 400 is formed of an organic resin material, the flexible property is ensured, and stress that can act on the pixel electrode layer 200 from the touch sensor layer 500 due to the user's touch operation can be reduced. However, the base material may be formed of an inorganic material in the case where the flexible property of the touch buffer layer 400 is ensured or high flexible property is not necessary. Further, in the case where the base material is an organic material, the uppermost layer of the encapsulation layer 300 may be an inorganic material layer in order to prevent mutual reaction between the encapsulation layer 300 and the touch buffer layer 400. In the first aspect, the inorganic material layer 300 is the uppermost layer of the encapsulation layer 300. In contrast, in the case where the base material is an inorganic material, the uppermost layer of the encapsulation layer 300 may be an organic material layer.

The touch sensor layer 500 is formed on the touch buffer layer 400. An insulating layer 506 and the bridge 522 are formed on the touch buffer layer 400, and the bridge 512 is formed over the bridge 522 with an insulating layer 507 interposed therebetween. The Y electrode 521 is formed on the insulating layer 506 with the insulating layer 507 and the bridge 512 interposed therebetween and is connected to the bridge 522 through a contact hole at a side of the insulating layer 507. A touch protection layer 530 is formed on the Y electrode 521, the insulating layer 507 and the bridge 512.

Figure 5:
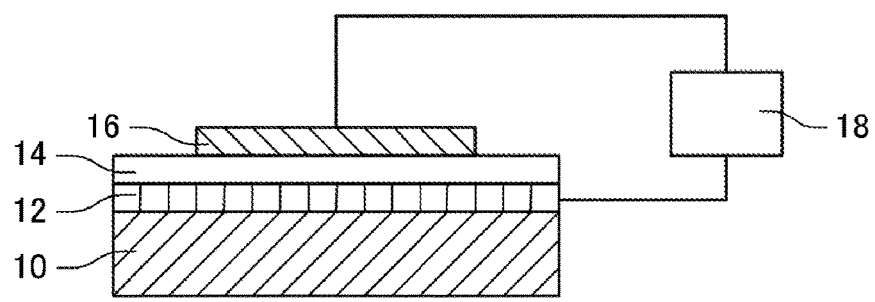
FIG. 5 is a view explaining an evaluating method of effects according to the first aspect of the present disclosure.

As described above, the dielectric constant of the touch buffer layer 400 is changed according to the content of the hollow particles 405. Here, samples of the touch buffer layer 400 were produced, and the dielectric constant and the like of each sample were evaluated. FIG. 5 shows a view explaining a measuring method. In each sample, an ITO electrode 12 was formed on a glass substrate 10, a sample layer 14 equivalent to the touch buffer layer was formed on the ITO electrode 12, and an aluminum electrode 16 was formed on the sample layer 14. Acrylic polymer (thermosetting resin) was used as the base material of the sample layer 14, and particles having a diameter of 80 nm and having a shell of acrylic resin (PMMA resin) were used as the hollow particles. Although the thermosetting resin was used as the base material of the sample layer 14, UV curable resin may be adopted as the base material of the touch buffer layer 400 in realistic implementation. The sample layer 14 was formed on the ITO electrode 12 by spin coating. Then, the sample layer 14 was thermally hardened, and the aluminum electrode 16 was deposited on the sample layer 14. The capacitance between the ITO electrode 12 and the aluminum electrode 16 was measured using a measuring device 18 by the capacitance method, and the dielectric constant of the sample layer 14 was calculated and compared based on the measured capacitance.

Comparative sample in which the amount of hollow particles added to the sample layer 14 was 0 wt % (that is, which did not include hollow particles), Sample 1 in which the amount of hollow particles added to the sample layer 14 was 30 wt %, and Sample 2 in which the amount of hollow particles added to the sample layer 14 was 50 wt % were prepared as the measurement samples. The measurement was performed at the frequencies of 1 kHz, 10 kHz, and 100 kHz for each of Comparative sample, Sample 1 and Sample 2.

Figure 6:
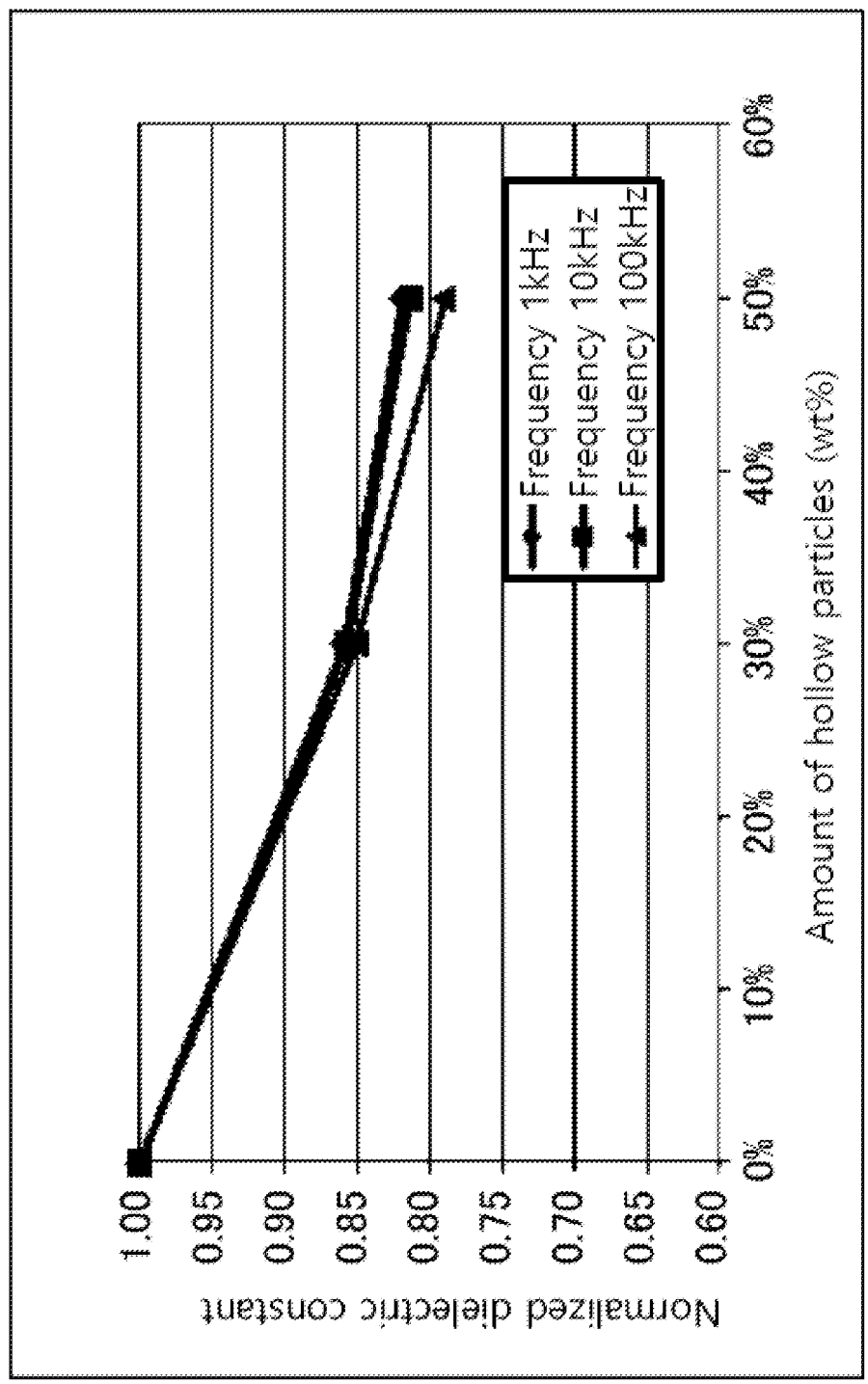
FIG. 6 is a graph illustrating evaluating results of effects according to the first aspect of the present disclosure.

FIG. 6 shows the results of measuring the dielectric constants of Comparative sample, Sample 1 and Sample 2 as normalized dielectric constants relative to the dielectric constant of Comparative sample. As shown in FIG. 6, when the dielectric constant of Comparative sample was 1, the normalized dielectric constant of Sample 1 was reduced to about 0.85 (reduction by about 15% as compared to Comparative sample) at each frequency, and the normalized dielectric constant of Sample 2 was reduced to about 0.80 (reduction by about 20% as compared to Comparative sample). That is, it was confirmed that the dielectric constant of the sample layer 14 is reduced by adding the hollow particles into the sample layer 14. In addition, although not specified as the measurement result, as can be seen from FIG. 6, it was confirmed that the desired dielectric constant (for example, about 0.9 normalized dielectric constant relative to the dielectric constant of Comparative sample) can be obtained when the amount of hollow particles added to the sample layer 14 is about 20 wt % or more. In addition, when the amount of hollow particles added to the sample layer 14 is 80 wt %, the white turbidity of the sample layer 14 was observed.

Therefore, in the touch buffer layer 400, the amount of hollow particles added to the base material may be 20 wt % or more to secure the dielectric constant reduction effect and may be less than 80 wt % to secure transparency. Further, the amount of hollow particles added to the base material may be 30 wt % or more and 50 wt % or less considering the balance between securing the dielectric constant reduction effect and securing the transparency.

In addition, optical properties (transmittance, haze and chromaticity) were also evaluated for Comparative sample, Sample 1 and Sample2. The optical properties of Sample 1 and Sample 2 were determined as good when there is no big change as compared with Comparative example. Table 1 shows the evaluation results of the optical properties. Further, in measuring each optical property, the spectrophotometer CM3600A (made by Konica Minolta) was used as an optical measuring apparatus.

TABLE 1

|  |  | Comparative sample | Sample 1 | Sample 2 |
| --- | --- | --- | --- | --- |
| Amount of hollow particles (wt %) |  | 0 | 30 | 50 |
| Transmittance (%) |  | 89.9 | 89.0 | 89.7 |
| Haze |  | 0.22 | 0.60 | 0.45 |
| Chromaticity | x | 0.317 | 0.318 | 0.319 |
| (D65) | y | 0.333 | 0.336 | 0.337 |

As shown in Table 1, the transmittance was 89.9% in Comparative sample, 89.0% in Sample 1, and 89.7% in Sample 2. It was confirmed that the addition of the hollow particles does not affect the transmittance. Moreover, the haze was 0.22 in Comparative sample, 0.60 in Sample 1, and 0.45 in Sample 2. The relationship between the addition of the hollow particles and haze was not confirmed. That is, it was confirmed that the addition of the hollow particles does not affect the haze and the low haze property is maintained. The coordinates of the chromaticity D65 were (0.317, 0.333) in Comparative sample, (0.318, 0.336) in Sample 1, and (0.319, 0.337) in Sample 2. It was confirmed that the addition of the hollow particles does not affect the chromaticity. That is, since the hollow particles 405 are nano-sized, it was confirmed from the results that the addition of the hollow particles 405 does not negatively affect the optical properties of the touch buffer layer 400.

As described above, the display device 1 of the first aspect includes the pixel electrode layer 200 formed on the substrate 100 and including the plurality of light emitting elements 220, each of which constitutes the pixel PX, arranged in two dimensions; the touch sensor layer 500 including the plurality of touch sensor electrodes (X electrodes 511 and Y electrodes 521), which constitute the touch sensor, arranged in two dimensions; and the optically transparent touch buffer layer 400 which is arranged between the pixel electrode layer 200 and the touch sensor layer 500 such that the pixel electrode layer 200 and the touch sensor layer 500 are capacitively coupled to each other. The touch buffer layer 400 includes the hollow particles 405 dispersed in the base material.

That is, the hollow particles 405 capable of reducing the dielectric constant in the capacitively coupled region are included in the optically transparent touch buffer layer 400, which is disposed between the pixel electrode layer 200 and the touch sensor layer 500 such that the two layers are capacitively coupled to each other. As a result, the detection noise, which may occur due to the pixel electrode layer 200 and the touch sensor layer 500 formed on the same substrate 100, can be suppressed, thereby realizing the display device 1 equipped with the touch sensor that can achieve both low cost characteristics and high touch detection accuracy. In another aspect, it is possible to reduce the thickness of the touch buffer layer 400 in a range where the capacitance of the touch buffer layer 400 is allowable. In this case, the display device 1 can be made thinner and lighter due to the thin thickness of the touch buffer layer 400. For example, the thickness of the touch buffer layer 400 may be about 2 to 3 μm.

In addition, as described above, it is beneficial that the base material of the touch buffer layer 400 is an organic material and the hollow particles 405 have an organic shell. This ensures the resin dispersibility of the hollow particles 405 in the base material. Furthermore, since the hollow particles 405 have an organic shell, the low haze property is maintained in the touch buffer layer 400. Specifically, the organic shell may be formed of acrylic resin for transparency.

In the touch buffer layer 400, the amount of the hollow particles 405 may be 20 wt % or more and less than 80 wt %. If the amount of the hollow particles 405 is 20 wt % or more, the desired dielectric constant reduction effect in the touch buffer layer 400 is secured. If the amount of the hollow particles 405 is less than 80 wt %, the transparency of the touch buffer layer 400 is secured. Particularly, in the touch buffer layer 400, the amount of the hollow particles 405 may be 30 wt % or more and 50 wt % or less. Thereby, the dielectric constant reduction effect and the transparency in the touch buffer layer 400 are reliably compatible.

The diameter of the hollow particles 405 is 400 nm or less, alternatively, 360 nm or less, or 300 nm or less. As described above, when the diameter of the hollow particles 405 is equal to or less than the visible light wavelength range, the visible optical property (scattering prevention) of the touch buffer layer 400 is maintained.

The touch buffer layer 400 also functions as a planarization layer formed to fill the recesses resulting from the shape of the pixel electrode layer 200. As such, the touch buffer layer 400 as the planarization layer also serves as a layer for reducing the dielectric constant between the pixel electrode 200 and the touch sensor layer 500, so that it is not necessary to add another layer for reducing the dielectric constant. This can contribute to the thinner thickness, lighter weight, lower cost, and the like of the display device 1.

The display device 1 further includes the encapsulation layer 300 including the inorganic material layers 310 and 330 and the organic material layer 320 stacked between the pixel electrode layer 200 and the touch buffer layer 400. Therefore, the sealing effect for the pixel electrode layer 200 from the external environment is surely obtained.

Furthermore, the light emitting element 220 of the pixel electrode layer 200 is formed from an OLED. The OLED includes the organic electroluminescent layer 222 and the anode electrode 221 and the cathode electrode 223 stacked with the organic electroluminescent layer 222 interposed therebetween. The pixel electrode layer 220 includes the driving element between the light emitting element 220 and the substrate 100 for applying a predetermined voltage between the anode electrode 221 and the cathode electrode 223. As described above, the first aspect can be properly applied to the display device 1 using the OLED.

<Second Aspect>

In the first aspect, the configuration in which the touch buffer layer includes the hollow particles is illustrated, and in a second aspect, the configuration in which not only the touch buffer layer but also a part of the layers constituting the encapsulation layer includes the hollow particles is illustrated.

Figure 7:
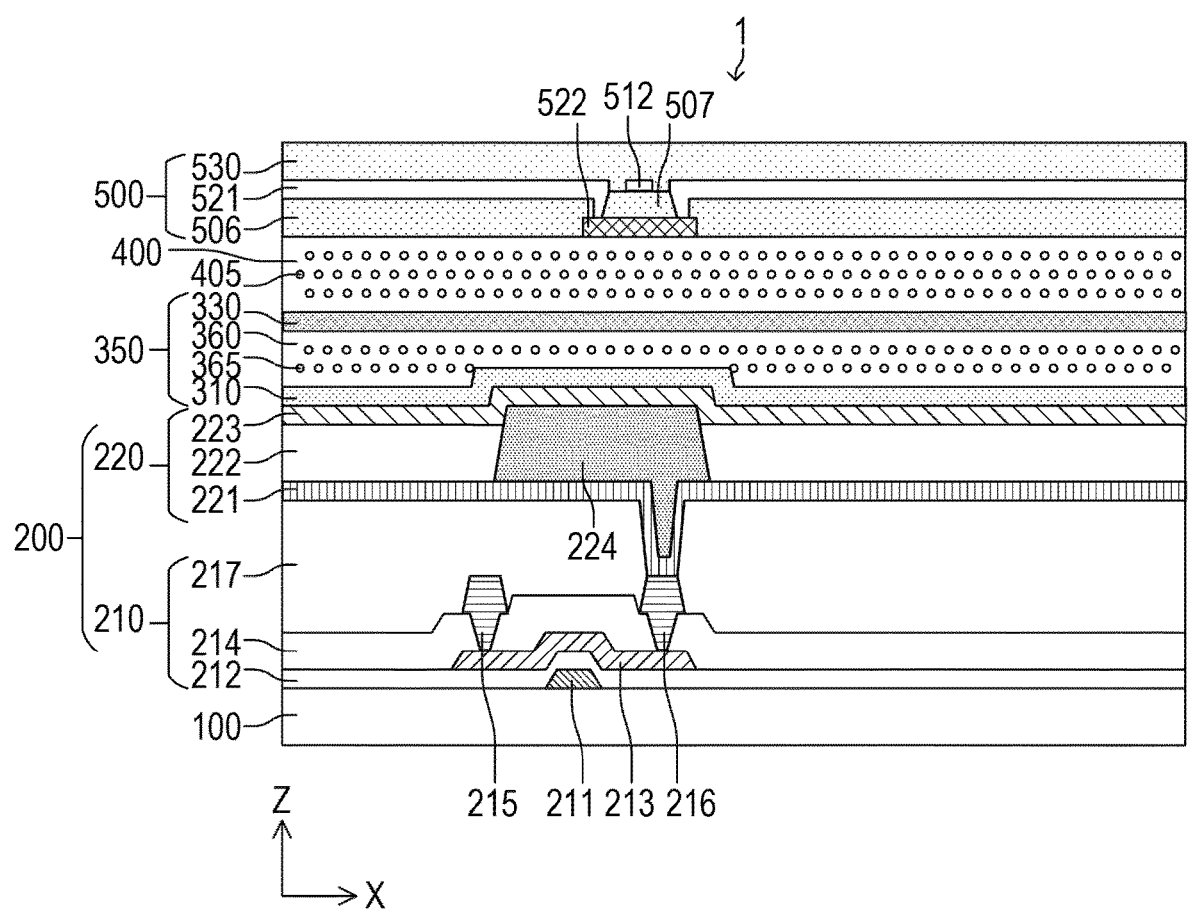
FIG. 7 is a schematic cross-sectional view of a display device according to a second aspect of the present disclosure.

FIG. 7 shows a schematic cross-sectional view of the display device 1 of the second aspect. In the display device 1 of the second aspect, the same parts as the display device 1 of the first aspect are designated by the same references, and the explanation of the same parts will be omitted or simplified. The display device 1 includes the pixel electrode layer 200, the encapsulation layer 350, the touch buffer layer 400 and the touch sensor layer 500 sequentially stacked on the substrate 100. In the display device 1 of the second aspect, the encapsulation layer 350 is different from the encapsulation layer 300 of the display device 1 of the first aspect.

The encapsulation layer 350 includes an inorganic material layer 310, an organic material layer 360 and an inorganic material layer 330 from the bottom on the cathode electrode 223. The encapsulation layer 350 has a sealing function of preventing external moisture, oxygen and the like of the display device 1 from reaching the light emitting element 220 like the encapsulation layer 300 of the first aspect. The organic material layer 360 includes an acrylic organic material resin as a base material and further includes nano-sized hollow particles 365 in the base material. In addition, the organic material used as the base material may be an epoxy resin, a siloxane resin, or the like in addition to the acrylic resin. The dielectric contact of the hollow particles 365 is sufficiently lower than that of the base material. Therefore, since the organic material layer 360 includes the hollow particles 365, the dielectric constant of the entire encapsulation layer 350 is lowered as compared with the case that the organic material layer 360 does not include the hollow particles 365. In addition, the encapsulation layer 350 is intended to be capable of realizing a desired encapsulation performance (for example, encapsulation performance almost equivalent to that of the encapsulation layer 300).

In addition, like the hollow particles 405 of the touch buffer layer 400, the diameter of the hollow particles 365 is equal to or less than about 400 nm, which is a substantial lower limit of the visible light wavelength range, or equal to or less than 360 nm, which is a certain lower limit, or equal to or less than 300 nm. Since the encapsulation layer 350 (the organic material layer 360) includes such nano-sized hollow particles 365, the dielectric constant of the encapsulation layer 350 can be reduced while maintaining its transparency. Further, the hollow particles 365 have an organic shell like the hollow particles 405.

The dielectric constant of the hollow particles is lower than that of the inorganic material layers 310 and 330. Therefore, although the second aspect illustrates the configuration in which the organic material layer 360 includes the hollow particles 365, the inorganic material layer 310 or 330 may include the hollow particles within a range where the desired sealing effect is obtained. That is, the second aspect requires that at least one layer of the layers constituting the encapsulation layer 350 is a layer containing the hollow particles 365.

As described above, in the display device 1 of the second aspect, at least one predetermined layer of the encapsulation layer 350 includes the hollow particles 365 dispersed in the base material. As a result, in addition to obtaining the respective effects of the first aspect, the dielectric constant reduction effect on the capacitive coupling of the pixel electrode layer 200 and the touch sensor layer 500 can be further improved.

Particularly, in the second aspect, the predetermined layer is the organic material layer 360, and the hollow particles 365 have an organic shell. Therefore, the resin dispersibility of the hollow particles 365 in the base material is ensured. Moreover, since the hollow particles 365 have the organic shell, the low haze property in the encapsulation layer 350 is maintained. Specifically, the organic shell may be formed of acrylic resin for transparency.

In addition, like the touch buffer layer 400, in the organic material layer 360, the amount of the hollow particles 365 may be 20 wt % or more and less than 80 wt %. Like the condition for the hollow particles 405, if the amount of the hollow particles 365 is 20 wt % or more, the desired dielectric constant reduction effect in the encapsulation layer 350 is secured. If the amount of the hollow particles 365 is less than 80 wt %, the transparency of the encapsulation layer 350 is secured. Particularly, in the encapsulation layer 350, the amount of the hollow particles 365 may be 30 wt % or more and 50 wt % or less. Thereby, the dielectric constant reduction effect and the transparency in the encapsulation layer 350 are reliably compatible.

The diameter of the hollow particles 365 is 400 nm or less, alternatively, 360 nm or less, or 300 nm or less. Like the condition for the hollow particles 405, when the diameter of the hollow particles 365 is equal to or less than the visible light wavelength range, the visible optical property (scattering prevention) of the encapsulation layer 350 is maintained.

Moreover, it is desirable that the predetermined layer (the organic material layer 360 in the second aspect) is formed of the same material as the touch buffer layer 400. In this way, by standardizing the material of the predetermined layer (organic material layer 360) and the material of the touch buffer layer 400, the costs of procuring and manufacturing the material are reduced.

<Third Aspect>

Figure 8:
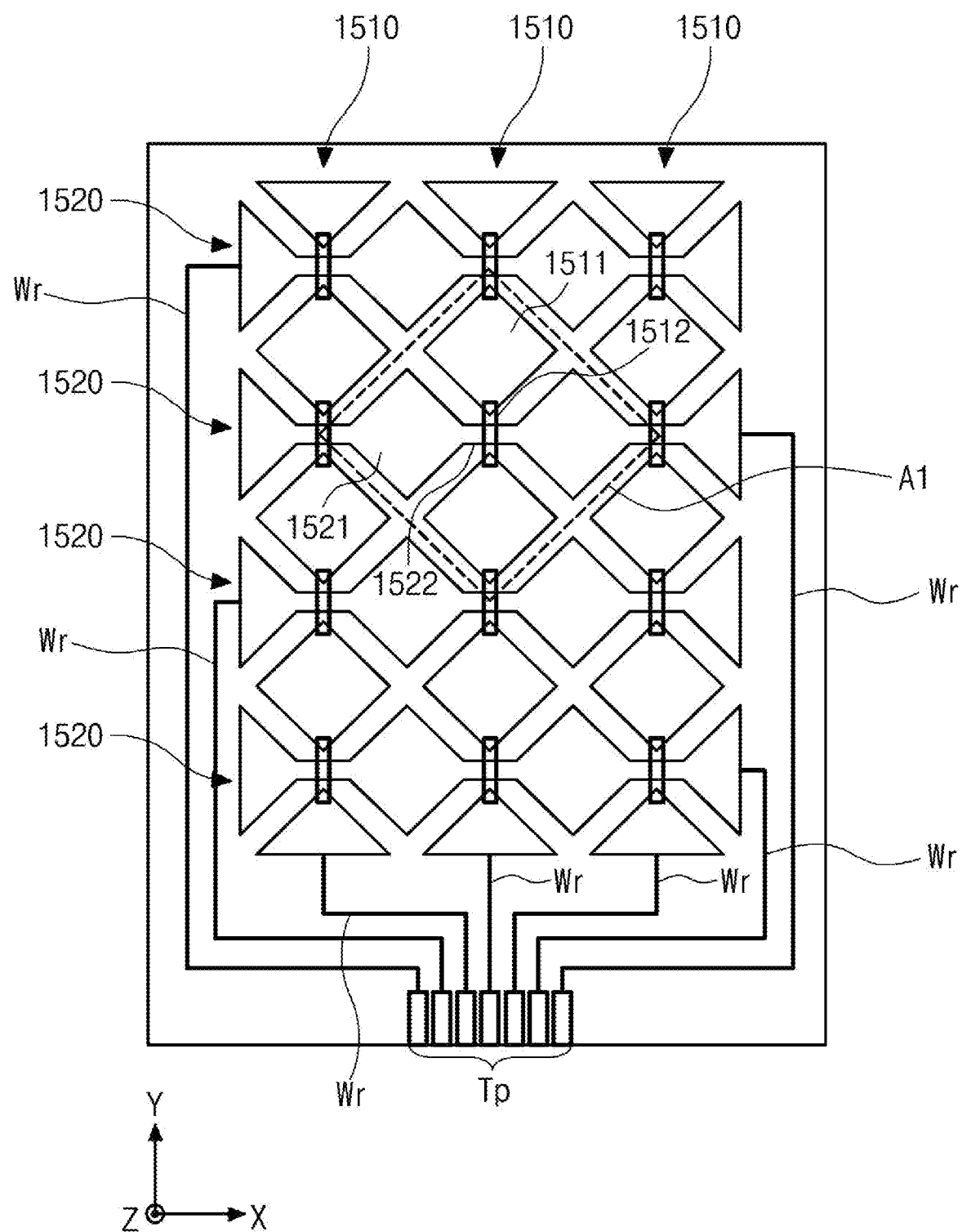
FIG. 8 is a schematic plan view of a touch sensor according to a third aspect of the present disclosure.

FIG. 8 is a schematic plan view of a touch sensor included in a display device according to a third aspect of the present disclosure. As shown in FIG. 8, the touch sensor according to the third aspect of the present disclosure includes a plurality of X electrode lines 1510 and a plurality of Y electrode lines 1520. The plurality of X electrode lines 1510 are spaced apart in the X direction and arranged in parallel to each other, and the plurality of Y electrode lines 1520 are spaced apart in the Y direction and arranged in parallel to each other. Each X electrode line 1510 includes a plurality of X electrodes 1511 (touch sensor electrode or first electrode) connected to each other through a first bridge 1512 in the Y direction. Each Y electrode line 1520 includes a plurality of Y electrodes 1521 (touch sensor electrode or second electrode) connected to each other through a second bridge 1522 in the X direction. The plurality of X electrodes 1511 and the plurality of Y electrodes 1521 are arranged to alternately cover different portions of the active area when viewed from the X-Y plane. Each X electrode line 1510 and each Y electrode line 1520 are connected to the detection processing circuit (not shown) for detecting touch operation through each wiring Wr, which is connected to one end of each row or each column. Here, a terminal Tp for connection with the detection processing circuit is formed at the end of each wiring Wr.

The plurality of X electrodes 1511 and the plurality of Y electrodes 1521 are formed of the same material in the same layer. In addition, the second bridges 1522 are formed of the same material in the same layer as the plurality of Y electrodes 1521. That is, the second bridges 1522 and the plurality of Y electrodes 1521 connected to each other therethrough are formed as one body.

Meanwhile, the first bridges 1512 are formed in a layer different from the plurality of X electrodes 1511. At this time, a touch insulating layer (not shown) is formed between the first bridges 1512 and the plurality of X electrodes 1511 in the Z direction, and the plurality of X electrodes 1511 are connected to the first bridges 1512 through contact holes formed in the touch insulating layer. In addition, the first bridges 1512 and the second bridges 1522 overlap each other, and the touch insulating layer is disposed between the first bridges 1512 and the second bridges 1522.

Each wiring Wr is formed of the same material in the same layer as the first bridges 1512 and is connected to the end of each X electrode line 1510 or each Y electrode line 1520 through a contact hole (not shown) formed in the touch insulating layer. Alternatively, each wiring Wr may be formed of the same material in the same layer as the plurality of X electrodes 1511 and the plurality of Y electrodes 1521. In addition, in the third aspect of the present disclosure, each X electrode 1511 and each Y electrode 1521 may have a mesh shape. The configuration of the touch sensor according to the third aspect of the present disclosure will be described in detail with reference to drawings.

Figure 9:
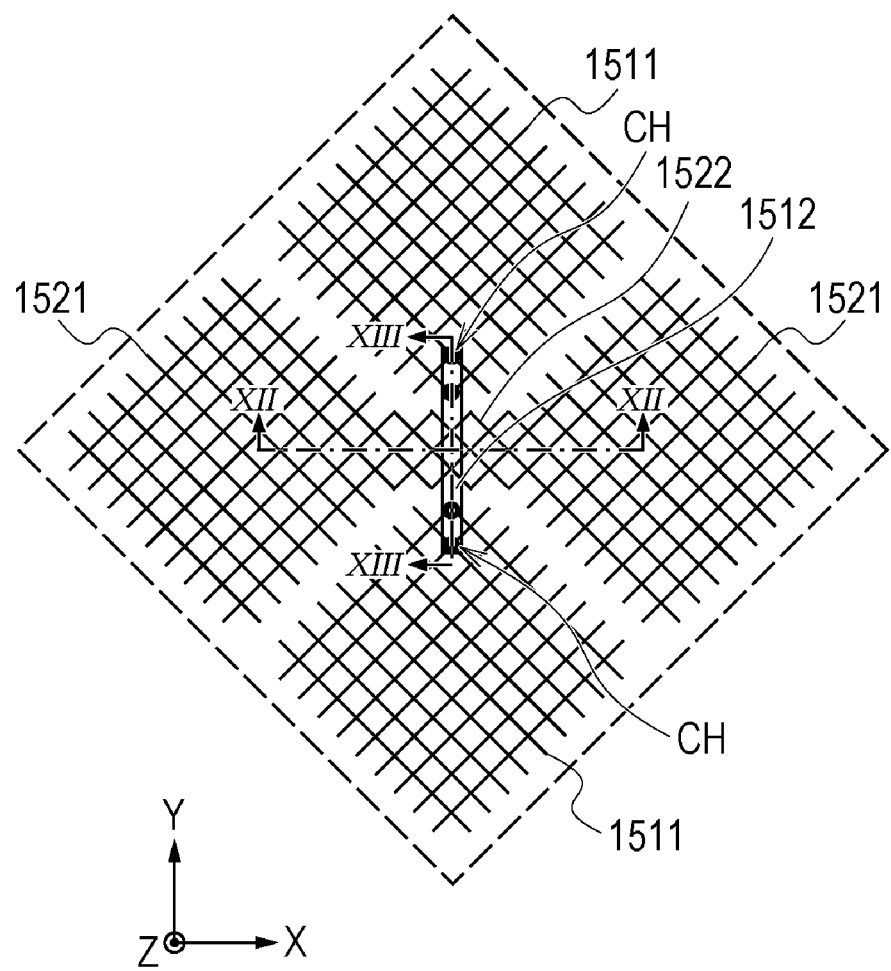
FIG. 9 is a schematic enlarged plan view of a touch sensor according to the third aspect of the present disclosure.
Figure 10:
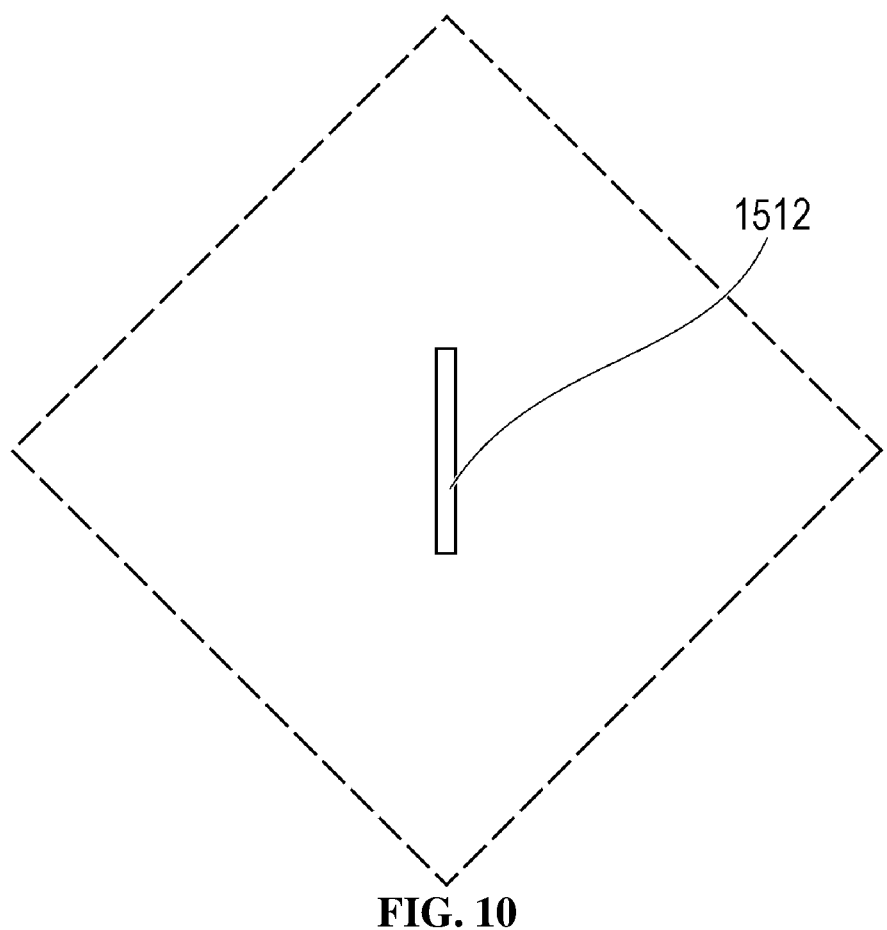
FIG. 10 is a schematic plan view of a first electrode layer of the touch sensor according to the third aspect of the present disclosure.
Figure 11:
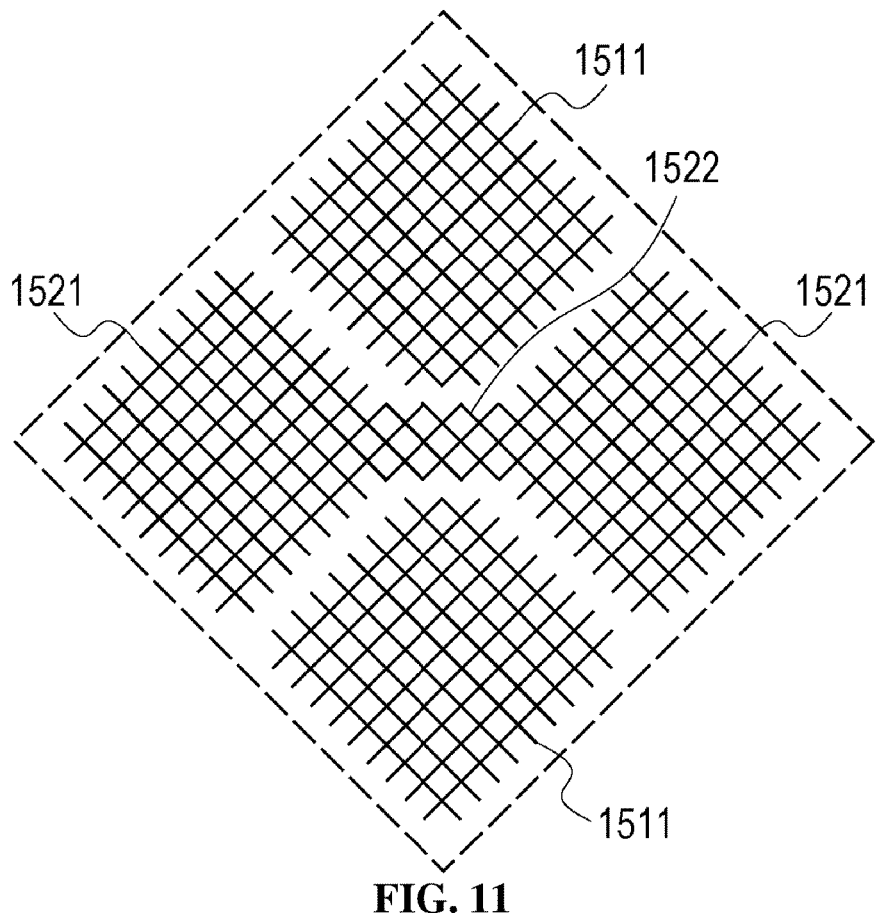
FIG. 11 is a schematic plan view of a second electrode layer of the touch sensor according to the third aspect of the present disclosure.
Figure 12:
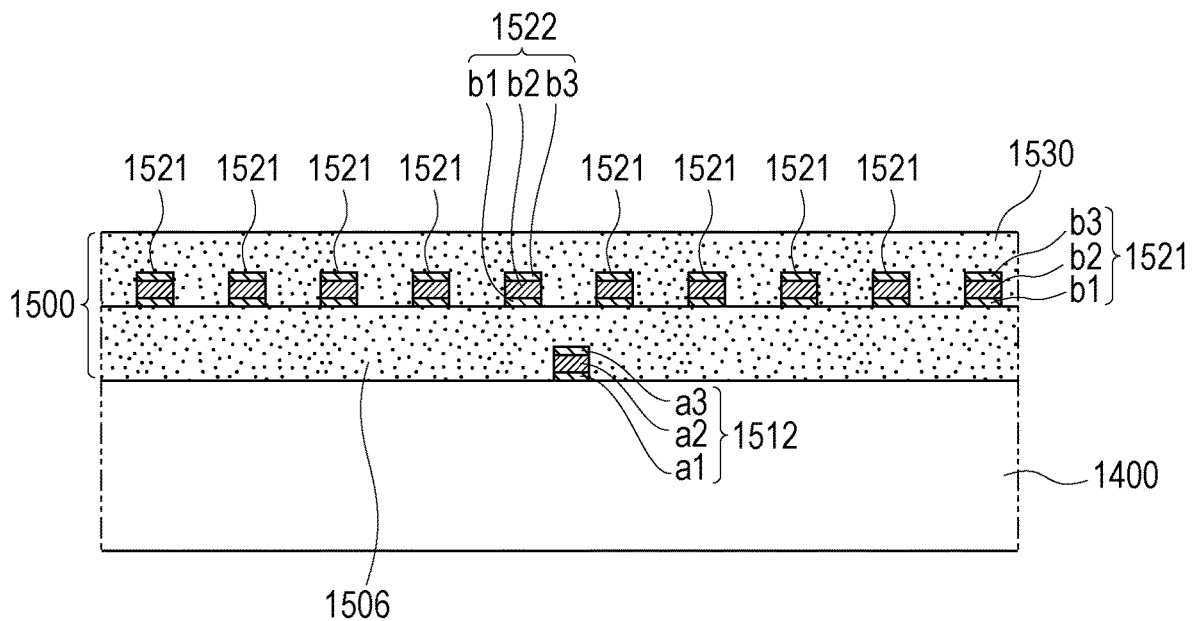
FIG. 12 is a schematic cross-sectional view of the touch sensor according to the third aspect of the present disclosure.
Figure 13:
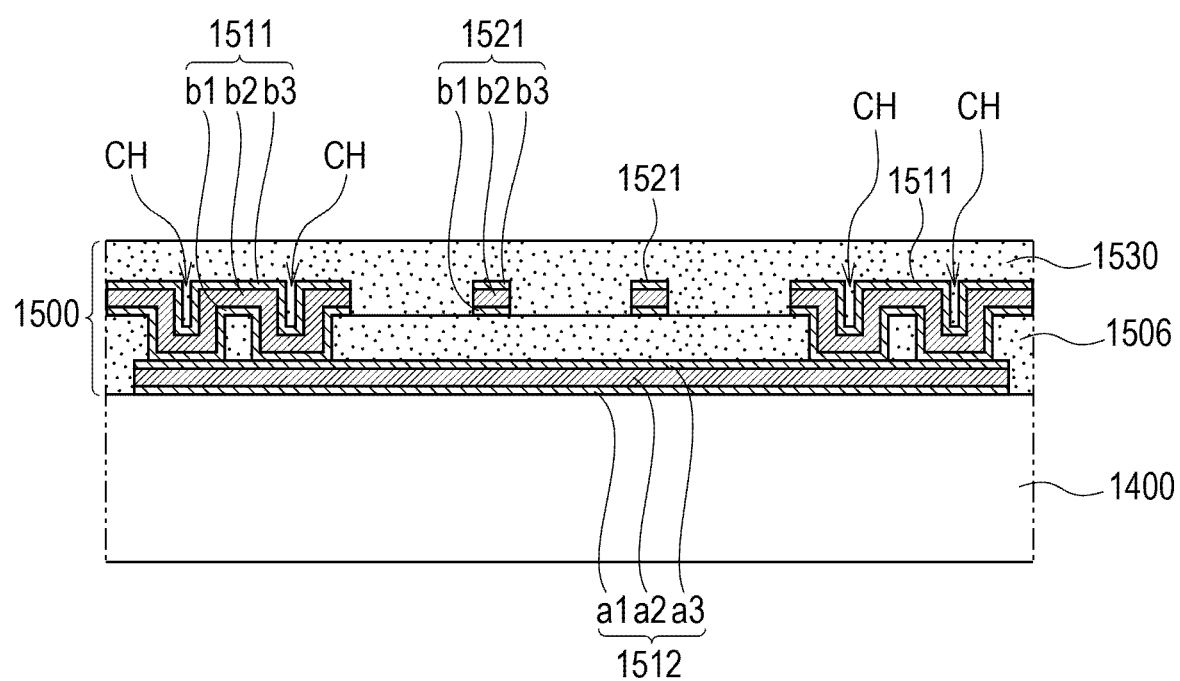
FIG. 13 is a schematic cross-sectional view of the touch sensor according to the third aspect of the present disclosure.

FIG. 9 is a schematic enlarged plan view of a touch sensor according to the third aspect of the present disclosure, in which the area µl of FIG. 8 is enlarged. FIG. 10 is a schematic plan view of a first electrode layer of the touch sensor according to the third aspect of the present disclosure. FIG. 11 is a schematic plan view of a second electrode layer of the touch sensor according to the third aspect of the present disclosure. FIG. 12 is a schematic cross-sectional view of the touch sensor according to the third aspect of the present disclosure and corresponds to the line XII-XII of FIG. 9. FIG. 13 is a schematic cross-sectional view of the touch sensor according to the third aspect of the present disclosure and corresponds to the line XIII-XIII of FIG. 9.

In FIGS. 9 to 13, the first bridge 1512 is formed as the first electrode layer on the touch buffer layer 1400. Here, the touch buffer layer 1400 may have the same configuration as the touch buffer layer 400 of FIG. 4 of the first aspect, but is not limited thereto. In addition, the pixel electrode layer and the encapsulation layer having the same configuration as those of the first aspect may be formed under the touch buffer layer 1400.

The first bridge 1512 may have at least one pattern. In the example of FIGS. 9 to 11, the first bridge 1512 has a straight line shape. Alternatively, the first bridge 1512 may have a bent line shape or a zigzag shape with at least one bent portion. Additionally, in the example of FIGS. 9 to 11, the first bridge 1512 is one, but the first bridge 1512 may be plural. The first bridge 1512 may be formed of a metal material and may have a multi-layer structure. For example, the first bridge 1512 has a three-layer structure including a first layer a1, a second layer a2 and a third layer a3, but is not limited thereto. The second layer a2 may be formed of a material different from the first layer a1 and the third layer a3, and the first layer a1 and the third layer a3 may be formed of the same material. The material of the second layer a2 may have lower dielectric constant than the material of the first layer a1 and the material of the third layer a3. For example, the second layer a2 may be formed of aluminum (Al) or aluminum alloy, and the first layer a1 and the third layer a3 may be formed of titanium (Ti) or titanium alloy. However, the present disclosure is not limited thereto. The thickness of the second layer a2 may be thicker than the thickness of each of the first layer a1 and the third layer a3 or may be thicker than the total of the thicknesses of the first layer a1 and the third layer a3. At this time, the thickness of the first layer a1 may be the same as the thickness of the third layer a3.

The touch insulating layer 1506 is formed on the first bridge 1512. The touch insulating layer 1506 may be formed of an inorganic insulating material. For example, the touch insulating layer 1506 may be formed of silicon nitride (SiNx), but is not limited thereto.

The touch insulating layer 1506 has contact holes CH exposing the top surface of both ends of the first bridge 1512. One end of the first bridge 1512 is exposed by at least one contact hole CH. For example, one end of the first bridge 1512 may be exposed by two contact holes CH, but is not limited thereto.

The X electrode 1511, the Y electrode 1521 and the second bridge 1522 are formed as the second electrode layer on the touch insulating layer 1506. Each of the X electrode 1511, the Y electrode 1521 and the second bridge 1522 has a mesh shape in which a plurality of line portions cross each other. Alternatively, the second bridge 1522 may be a single line extending in the X direction or may be a plurality of lines.

Each line portion of the X electrode 1511, the Y electrode 1521 and the second bridge 1522 is disposed to correspond to the bank 224 of FIG. 4. Here, one opening of the mesh shape may correspond to at least one pixel PX of FIG. 1, but is not limited thereto.

Two X electrodes 1511 adjacent to each other in the Y direction are connected to both ends of the first bridge 1512 through the contact holes CH formed in the touch insulating layer 1506, respectively. In addition, two Y electrodes 1521 adjacent to each other in the X direction are united with the second bridge 1522 and connected to both ends of the second bridge 1522, respectively. The line portions of the Y electrode 1521 are positioned to overlap the pattern of the first bridge 1512.

Each of the X electrode 1511, the Y electrode 1521 and the second bridge 1522 may be formed of a metal material and may have a multi-layer structure. For example, each of the X electrode 1511, the Y electrode 1521 and the second bridge 1522 has a three-layer structure including a first layer b1, a second layer b2 and a third layer b3, but is not limited thereto. The second layer b2 may be formed of a material different from the first layer b1 and the third layer b3, and the first layer b1 and the third layer b3 may be formed of the same material. The material of the second layer b2 may have lower dielectric constant than the material of the first layer b1 and the material of the third layer b3. For example, the second layer b2 may be formed of aluminum (Al) or aluminum alloy, and the first layer b1 and the third layer b3 may be formed of titanium (Ti) or titanium alloy. However, the present disclosure is not limited thereto. The thickness of the second layer b2 may be thicker than the thickness of each of the first layer b1 and the third layer b3 or may be thicker than the total of the thicknesses of the first layer b1 and the third layer b3. At this time, the thickness of the first layer b1 may be the same as the thickness of the third layer b3.

The touch protection layer 1530 is formed on the X electrode 1511, the Y electrode 1521 and the second bridge 1522.

In the third aspect of the present disclosure, the first bridge 1512 is formed in a layer different from the plurality of X electrodes 1511, and the second bridge 1522 is formed in the same layer as the plurality of Y electrodes 1521. However, the present disclosure is not limited thereto. Alternatively, the first bridge 1512 may be formed in the same layer as the plurality of X electrodes 1511 and may be united with the plurality of X electrodes 1511 as one body. The second bridge 1522 may be formed in a layer different from the plurality of Y electrodes 1521, and the plurality of Y electrodes 1521 may be connected to the second bridge 1522 through contact holes.

The X electrode 1511, the Y electrode 1521, the first bridge 1512 and the second bridge 1522 of the third aspect may be formed of a metal material and may be patterned to have a mesh shape as described above. However, other configuration may be applied. For example, at least one of the X electrode 1511, the Y electrode 1521, the first bridge 1512 and the second bridge 1522 may be a plate-shaped electrode using a transparent conductive layer as in the first aspect. Alternatively, at least one of the X electrode 1511, the Y electrode 1521, the first bridge 1512 and the second bridge 1522 may have a stacked structure of a plate-shaped transparent conductive layer and a mesh-shaped metal layer.

Modification Example

Although the exemplary aspects of the present disclosure have been described above, they are merely examples of some aspects to which the present disclosure can be applied and do not prevent proper modification or alteration within the scope of the present disclosure. Moreover, it is possible to implement proper combination of the aspects described above. For example, the present disclosure can be modified in various forms as disclosed hereinafter.

(1) Modifications About the Type of the Display Device 1.

In each aspect, the display device including the pixel electrode layer 200 using the OLED and the projected capacitive type touch sensor layer 500 is illustrated. The types of the pixel electrode layer 200 and the touch sensor layer 500 are not limited thereto. The present disclosure can be applied to various display devices which aim to reduce the dielectric constant of the capacitively coupled portion of the pixel electrode layer and the touch sensor layer. For example, the present disclosure may be applied to a display device which has another light emitting structure such as a pixel electrode layer including micro LEDs and a driving circuit. In addition, the present disclosure may be applied to a display device which has a surface capacitive type touch sensor layer.

(2) Modification About the Light Emitting Element 220 (Pixel PX)

In each aspect, it is illustrated that the light emitting element 220 emitting red, the light emitting element 220 emitting green, the light emitting element 220 emitting blue and the light emitting element 220 emitting white are provided for the pixels PX, but the structure of the light emitting element for the pixel PX is not limited thereto. For example, all the light emitting elements 220 may emit the same color (for example, white or blue) and a color filter required for each pixel PX may be added. Moreover, in each pixel PX, a transparent Stacked OLED (SOLED) in which a red luminescent organic EL layer, a green luminescent organic EL layer and a blue luminescent organic EL layer are stacked with a protection layer interposed therebetween may be adopted. In this case, the configuration of the driving circuit of the light emitting element 220 is also properly changed.

(3) Modification About the Physical Properties of the Encapsulation Layer 300 or 350 and the Touch Buffer Layer 400.

In each aspect, the inorganic material layer 310, the organic material layer 320 or 360, the inorganic material layer 330 and the organic material layer 400 are sequentially arranged from the encapsulation layer 300 or 350 to the touch buffer layer 400. Meanwhile, the arrangement of the organic material and the inorganic material is not limited thereto. For example, the encapsulation layer 300 or 350 may be a layer in which the organic material layers and the inorganic material layers are stacked four or more. Alternatively, the encapsulation layer 300 or 350 may include one organic material layer and one inorganic material layer. In any case, when the touch buffer layer 400 is an organic material layer, the uppermost layer of the encapsulation layer 300 or 350 (that is, the layer contacting the touch buffer layer 400) may be an inorganic material layer. In addition, when the touch buffer layer 400 is an inorganic material layer, the uppermost layer of the encapsulation layer 300 or 350 may be an organic material layer.

(4) Modification About the Arrangement of the Encapsulation Layer 300 or 350 and the Touch Buffer Layer 400

In each aspect, it is illustrated that the encapsulation layer 300 or 350 and the touch buffer layer 400 are divided and the touch buffer layer 400 is stacked on the encapsulation layer 300 or 350. However, the encapsulation layer 300 or 350 and the touch buffer layer 400 may be arranged to be mixed. That is, at least one layer of the organic material layers and the inorganic material layers alternately stacked between the pixel electrode layer 200 and the touch sensor layer 500 may be defined as the touch buffer layer 400. In other words, as long as the encapsulation layer 300 or 350 and the touch buffer layer 400 have the sealing function, the planarization function, the buffer function and the dielectric constant reduction function overall as described above, the encapsulation layer 300 or 350 and the touch buffer layer 400 may be arranged to be mixed with each other.

(5) Modification About the Diameter of the Hollow Particles 405 or 365.

In each aspect, the diameter of the hollow particles 405 is equal to or less than the lower limit of the visible light wavelength for scattering prevention of the visible light. Meanwhile, under the condition that the thickness of the touch buffer layer 400 is relatively large and the desired optical properties are obtained, the diameter of the hollow particles 405 may be equal to or more than the upper limit of the visible light wavelength (about 760 to 830 nm). The same can be applied to the hollow particles 365 in the encapsulation layer 350.

According to the display device of the present disclosure, a display device equipped with a touch sensor with improved touch detection accuracy is realized.

It will be apparent to those skilled in the art that various modifications and variations can be made in a display device of the present disclosure without departing from the sprit or scope of the aspects. Thus, it is intended that the present disclosure covers the modifications and variations of this disclosure provided they come within the scope of the appended claims and their equivalents.

What is claimed is:

1. A display device comprising:
    a pixel electrode layer in which a plurality of light emitting elements constituting respective pixels are arranged in two dimensions;
    a touch sensor layer in which a plurality of touch sensor electrodes constituting a touch sensor are arranged in two dimensions; and
    a touch buffer layer between the pixel electrode layer and the touch sensor layer that are capacitively coupled to each other,
    wherein the touch buffer layer is optically transparent and includes a base material and hollow particles dispersed in the base material, and
    wherein the base material of the touch buffer layer includes an organic material and the hollow particles each include an organic shell.

2. The display device of claim 1, wherein the organic shell is formed of polymethyl methacrylate.

3. The display device of claim 1, wherein the organic shell is formed of acrylic resin.

4. The display device of claim 1, wherein an amount of the hollow particles in the touch buffer layer is 20 wt % or more and less than 80 wt %.

5. The display device of claim 1, wherein an amount of the hollow particles in the touch buffer layer is 30 wt % or more and 50 wt % or less.

6. The display device of claim 1, wherein each of the hollow particles has a diameter of 400 nm or less.

7. The display device of claim 1, further comprising an encapsulation layer between the pixel electrode layer and the touch buffer layer,
wherein the encapsulation layer includes an organic material layer and an inorganic material layer stacked.

8. The display device of claim 7, wherein at least one of the organic material layer and the inorganic material layer includes a base material and hollow particles dispersed in the base material.

9. The display device of claim 8, wherein the hollow particles have an organic shell.

10. The display device of claim 9, wherein the organic shell of the hollow particles is formed of acrylic resin.

11. The display device of claim 8, wherein an amount of the hollow particles is 20 wt % or more and less than 80 wt %.

12. The display device of claim 8, wherein an amount of the hollow particles is 30 wt % or more and 50 wt % or less.

13. The display device of claim 8, wherein each of the hollow particles has a diameter of 400 nm or less.

14. The display device of claim 8, wherein the at least one of the organic material layer and the inorganic material layer is formed of a same material as the touch buffer layer.

15. The display device of claim 1, wherein the touch buffer layer is a planarization layer that fills recesses having a shape of the pixel electrode layer.

16. The display device of claim 1, wherein the light emitting elements of the pixel electrode layer includes an organic light emitting diode,
wherein the organic light emitting diode includes an anode electrode, an organic electroluminescent layer, and a cathode electrode, and
wherein the pixel electrode layer includes a driving element for applying a predetermined voltage between the anode electrode and the cathode electrode.

17. The display device of claim 1, wherein the plurality of touch sensor electrodes includes at least one of a plate-shaped transparent electrode and a mesh-shaped metal electrode.

18. The display device of claim 1, wherein the plurality of touch sensor electrodes includes a plurality of first electrodes, a plurality of second electrodes, a first bridge electrically connecting the plurality of first electrodes, and a second bridge electrically connecting the plurality of second electrodes,
wherein the first bridge and the second bridge are disposed in different layers, and
wherein the first bridge and the second bridge overlap each other.

19. A display device comprising:
a pixel electrode layer where a plurality of light emitting elements is disposed;
a touch sensor layer where a plurality of touch sensor electrodes is disposed;
a touch buffer layer between the pixel electrode layer and the touch sensor layer; and
wherein the touch buffer layer includes an organic material and hollow particles having an organic shell dispersed in the organic material, and
wherein the plurality of touch sensor electrodes includes a plurality of first electrodes and a plurality of second electrodes that are disposed to alternately cover different portions of the touch sensor layer, a first bridge electrically connecting the plurality of first electrode, and a second bridge electrically connecting the plurality of second electrodes.

20. The display device of claim 19, wherein the first bridge and the second bridge are disposed in different layers and overlap each other.

* * * * *